(12) United States Patent
Lauer

(10) Patent No.: US 10,371,778 B2
(45) Date of Patent: Aug. 6, 2019

(54) METHOD AND MAGNETIC RESONANCE APPARATUS FOR RECORDING A MAGNETIC RESONANCE DATA SET

(71) Applicant: Siemens Healthcare GmbH, Erlangen (DE)

(72) Inventor: Lars Lauer, Neunkirchen (DE)

(73) Assignee: Siemens Healthcare GmbH, Erlangen (DE)

( * ) Notice: Subject to any disclaimer, the term of this patent is extended or adjusted under 35 U.S.C. 154(b) by 198 days.

(21) Appl. No.: 15/456,802

(22) Filed: Mar. 13, 2017

(65) Prior Publication Data

US 2017/0261579 A1    Sep. 14, 2017

(30) Foreign Application Priority Data

Mar. 14, 2016 (DE) ........................ 10 2016 204 145

(51) Int. Cl.
| | |
|---|---|
| *G01V 3/00* | (2006.01) |
| *G01R 33/48* | (2006.01) |
| *G01R 33/56* | (2006.01) |
| *G01R 33/50* | (2006.01) |

(52) U.S. Cl.
CPC ..... *G01R 33/4828* (2013.01); *G01R 33/5608* (2013.01); *G01R 33/50* (2013.01)

(58) Field of Classification Search
USPC ....................................................... 324/309
See application file for complete search history.

(56) References Cited

U.S. PATENT DOCUMENTS

| | | | | |
|---|---|---|---|---|
| 10,094,899 | B2 * | 10/2018 | Wiesinger | ............... G01R 33/50 |
| 10,124,114 | B2 * | 11/2018 | Raghavan | ........... A61M 5/1723 |
| 2015/0008919 | A1 * | 1/2015 | Grodzki | ............... G01R 33/543 324/309 |
| 2015/0241540 | A1 * | 8/2015 | Vernickel | ......... G01R 33/56358 324/309 |
| 2016/0217555 | A1 * | 7/2016 | Ertel | ....................... G06T 19/00 |
| 2017/0319097 | A1 * | 11/2017 | Amthor | .................. A61B 5/055 |
| 2018/0074148 | A1 * | 3/2018 | Pfeuffer | ............. G01R 33/4818 |

FOREIGN PATENT DOCUMENTS

DE    102013202768 A1    7/2014

OTHER PUBLICATIONS

Ma et al., "Magnetic Resonance Fingerprinting," Nature, vol. 495, Nr. 7440, pp. 187-192 (2013).

* cited by examiner

*Primary Examiner* — Rodney E Fuller
(74) *Attorney, Agent, or Firm* — Schiff Hardin LLP

(57) ABSTRACT

In a method and apparatus for recording a magnetic resonance data set, an MR data acquisition scanner is operated to acquire a range of basic values of a material parameter of a subject, with a basic resolution within a region of the subject. Thereafter, the aforementioned resolution is refined by selecting a refinement acquisition sequence, dependent on a material property to be refined, and then again operating the scanner to acquire further values for the refinement material parameter with a refined resolution, compared to the original resolution.

18 Claims, 3 Drawing Sheets

METHOD AND MAGNETIC RESONANCE APPARATUS FOR RECORDING A MAGNETIC RESONANCE DATA SET

BACKGROUND OF THE INVENTION

Field of the Invention

The invention concerns a method for recording a magnetic resonance data set of a target region of an examination object, especially of a patient, identified in each case by at least one parameter value of at least one material parameter in different image elements, with a magnetic resonance scanner. The method is of the type wherein, in a series of establishing steps, initially within the framework of a magnetic resonance sequence, magnetic resonance signals of a measurement region are recorded and thereafter, to establish each parameter value, the magnetic resonance signal of the respective image elements is compared with comparison signals specific for the magnetic resonance sequence, to which in each case assignment values of the at least one material parameter are assigned such that overall a range of values of the at least one material parameter in a defined resolution will be covered. The assignment value of the at least one material parameter, which is assigned to the comparison signal with the closest match, is used as the parameter value. The invention also concerns a magnetic resonance apparatus and an electronically readable data storage medium for implementing such a method.

Description of the Prior Art

Magnetic resonance imaging is a widely known imaging modality that is frequently employed in the medical context, in which a patient is the examination object. Such imaging is known as qualitative imaging, the aim of which is to generate a magnetic resonance image data set, which shows anatomical structures, in particular tissue, in order to be able to make diagnostic conclusions based hereon, about the state of health of a patient. Options for what is known as quantitative magnetic resonance imaging have also been proposed. Here quantitative material parameters, which can be measured by the magnetic resonance, are established, so that the magnetic resonance data sets produced of a target region to be recorded do not necessarily contain image values in the image elements of the magnetic resonance data set, but contain parameter values of at least one material parameter, so that the magnetic resonance data set can ultimately also be understood as a type of parameter map of the target region. Examples of material parameters determined in this way are the proton density and relaxation times, in particular the T1 relaxation time, the T2 relaxation time and the T2* relaxation time. The use of varying spatial resolution is known both for quantitative and also for qualitative magnetic resonance imaging. Thus an overview image of the target region can first be recorded, in which a subregion of interest can then be selected automatically and/or manually, for which new magnetic resonance data are recorded with a higher spatial resolution, in order, for example, to be able to present the region around a suspected lesion in a higher spatial resolution.

A proposed approach for quantitative magnetic resonance imaging, i.e. the determination of parameter values for at least one material parameter, is known as magnetic resonance fingerprinting as described, for example, the article by D. Ma et al., "Magnetic Resonance Fingerprinting", Nature 495:187-192 (2013). In this article, instead of the usual magnetic resonance sequences, specific, pseudo-randomized magnetic resonance sequences with, for example, specific sequences of excitations, are used in order to induce a magnetic resonance signal of different materials, in particular different tissue, which is unique and thus represents a type of fingerprint, which in turn is a function of the material parameters or material characteristics that are to be discovered. In other words specific magnetic resonance sequences, usually containing a number of excitation pulses, are used in order to record magnetic resonance signals for image elements, which can then be identified as a specific fingerprint, by comparison, in particular correlation, with a library of comparison signals. The comparison signal that has the highest correlation is then given assignment values for the different material parameters, which can then be employed as the parameter values of the material parameters for the magnetic resonance data set.

In this case the assignment values cover specific ranges of values of the material parameters in a specific resolution, which serve as the basis for determining the combinations of values of the material parameters that have a sufficient, reliable ability to distinguish between the comparison signals themselves, and thus on comparison with the magnetic resonance signal. This allows an assignment that is as robust as possible, ideally a unique assignment, is to be made and ambiguities are avoided. In practice, it has been shown, however, that the number of the material parameter value combinations that can be distinguished by a magnetic resonance signal to be created for a specific magnetic resonance sequence is limited, particularly in the case of a patient as the examination object, wherein large overall ranges of values are to be covered. This is at the expense of the resolution of the material parameters in this range of values. In addition, the magnetic resonance sequence must be selected so that ideally an assignment of magnetic resonance signals to comparison signals can be done over the entire target region. These boundary conditions lead to a restriction of the resolution in the ranges of values for parameter values in quantitative imaging.

SUMMARY OF THE INVENTION

An object of the invention is therefore to enable at least locally improved resolution of the parameter values of material parameters in quantitative magnetic resonance imaging.

This object is achieved in a method of the type described at the outset, wherein, in accordance with the invention, that after the series of establishing steps has been carried out for the overall target region with a basic magnetic resonance sequence and with a range of basic values and a basic resolution for each material parameter, at least local refinement is made of the resolution of at least one refinement material parameter of the at least one material parameter in a refinement region covering at least one part of the target region. A refining magnetic resonance sequence optimized as to an ability to differentiate the comparison signals in a target resolution in a range of target values. The sequence is selected dependent on the parameter values of the at least one refinement material parameter in the refinement region, and/or dependent on prespecified information, and the series of establishing steps is carried out for the refinement region as measurement region with the refinement magnetic resonance sequence, the range of target values and the target resolution.

The invention thus is an expansion of the concept of sectional enlargement of the image domain to the quantitative parameter region, in which the resolution relating to the parameter values of the material parameters can be explicitly increased. Thus a step-by-step refinement of the measurement is implemented in a number of stages, in relation to the range of values and the gradation of the acquired quantitative material parameters. This is advantageous in the case of high-precision measurement methods such as magnetic resonance fingerprinting, since the resolution of the measurement scales that can be achieved, for example of a T2 relaxation time as material parameter, is in inverse proportion to the size of the range of values covered. Expressed differently, with a restriction of the range of values, a magnetic resonance sequence can be selected for creating the magnetic resonance signals, which, although it might be ambiguous for a wider range of values, allows an improved ability to be distinguished within the restricted range of target values compared to the range of basic values for smaller gradations of parameter values of the at least one material parameter. Increased target resolution compared to the basic resolution (or a previous target resolution) is thus achieved. It is also possible within the framework of the present invention to save measurement and reconstruction time if, through a sensible restriction of the range of values, only a smaller range of target values has to be scanned or encoded by the measurement.

Initially in an overview measurement with a range of basic values and a basic resolution, i.e. coarser scaling of the material parameters, the ability is provided to identify conspicuous or relevant ranges of values, so that in at least one further step the level of precision, i.e. here the resolution of the parameter value, can be increased step-by-step. Thus, by an extremely precise determination of material parameters, for example T1, T2 and if necessary further parameters, an exact characterization of the tissue type of a tumor can be undertaken for a patient as the examination object.

As noted, in an embodiment of the present invention a further refinement is undertaken for at least one refinement material parameter, based on the result of a directly preceding series of establishing steps serving to make the refinement. This means that, provided there are suitable magnetic resonance sequences available that make possible a sufficient distinction of comparison signals in further restricted ranges of target values for further increased target resolutions, there can be a step-by-step, ever more exact determination of parameter values of at least one refinement material parameter. Parameter values of the at least one refinement material parameter that have been established in the preceding refinement step are used in the subsequent step or steps, so that ultimately only in the first refinement does there have to be recourse to the parameter values that were established on the basis of the basic magnetic resonance sequence, to enable the range of target values and the target resolution to be established.

It should be noted once again that within the framework of the quantitative magnetic resonance imaging it is possible, and in many cases it is also usual, to consider a number of material parameters, for example the normal relaxation times and the proton density. The refinement can then relate only to these material parameters or a subgroup of these material parameters, meaning that it is entirely possible to employ only some of the originally considered material parameters as refinement material parameters for which there is a particular interest. In some cases this can make it easier to discover a suitable refinement magnetic resonance sequence. In other cases, however, it can be sensible to increase the resolution in relation to all material parameters considered.

Particularly for assignment of combinations of assignment values of different material parameters to the comparison signals, the refinement magnetic resonance sequence can also be established as a function of parameter values of material parameters in the refinement region that are not to be refined in their resolution. This is because even these parameters help to determine the combinations that are relevant and it can also be predicted, on the basis of the available parameter values for the material parameters not to be refined, which combinations will be needed during refinement. Accordingly it is also preferred to take this into consideration when selecting the refinement magnetic resonance sequence to be used.

As has been mentioned, the decision about a refinement as well as the range of target values or the target resolution is preferably based on a consideration of the parameter values for the refinement region obtained from the preceding measurement, and the choice of the refinement region itself. For the latter it is taken into account in which regions of the target region a rather homogeneous distribution of parameter values occurs in a narrower range of values, or at least an interval in which a majority of the parameter values lie, and those regions or that interval can then define the range of target values.

It is thus expedient for automatic determination of the at least one refinement material parameter and/or of the refinement region and/or of the refinement magnetic resonance sequence, to implement an analysis of the parameter value distribution, such as a histogram, over a number of image elements. It is thus considered for which material parameters or which subregion of the target region an effective beneficial narrowing of the range of values can be undertaken for the material parameters, which leads to an improved target resolution. The analysis can also identify in which subregion or for which material parameter especially conspicuous parameter values are present, which justify a more precise examination or provide a hint that a specific anomaly is present. Statistical histogram observations are available for this purpose, in which checks can be made, for example, as to whether a specific predetermined percentage of parameter values of at least one material parameter for a subregion of the target region or the entire target region lies within a specific interval. This intervention preferably defines the range of target values (and thus essentially the choice of the refinement magnetic resonance sequence). This check can be made based on image elements. A check can also be made in a histogram, or generally in a parameter value distribution, as to whether the number of parameter values in a specific interval, which points to an anomaly to be investigated, for example a tumor, exceeds a threshold value.

In a further embodiment of the invention, the selection of one of the at least one refinement material parameters and/or refinement regions and/or of the refinement magnetic resonance sequence is made dependent on at least one refinement criterion that describes accumulations of values deviating from a normal distribution. Also, the relevant ranges of values in the parameter value distribution, in particular, the histogram determined by the threshold value just mentioned, can be compared with normal distributions. Such normal distribution in the example of a patient as the examination object, for example, which distributions are expected in the target region or in a subregion, so that it can quickly be determined in which subregions anomalies to be investigated are present, that more closely relate to the parameter values, and which range of target values is relevant. For example, in the case of patients as examination objects, it is often true to say that material parameters deviate from usual normal values within a tumor or another lesion, since the tissue and thus also its material characteristics that the material parameters describe, is changed. If a measurement is now carried out in the relevant ranges of target values, the tissue, which may possibly be malignant, can be very well described.

In another embodiment of the invention, at least one of the at least one refinement regions, which is smaller than the target region, is selected as a subregion containing parameter values of at least one of the at least one refinement parameters deviating from the normal distribution and/or a region of interest predetermined by a user and/or by analysis of a preceding measurement in the target region. As has been shown, subregions with peculiarities may be discovered automatically using specific refinement criteria, however it is also conceivable for it to already be known in advance, for example from qualitative magnetic resonance imaging, which subregion of the target region can be of interest as the refinement region. Accordingly prior information already obtained may be used to be able to choose the refinement region.

As described, the range of target values is then produced in most cases directly from the proportion of the parameter values of the preceding establishment thereof, which it is desired to measure more precisely. This can be done, for example so that at least a prespecified proportion, such as greater than 80%, of the parameter values of the different image elements of the refinement region lies within the range of target values. In this embodiment, it is not critical whether a specification accuracy for a part of the parameter values within the refinement region must be taken into account.

Accordingly in another embodiment of the present invention, an image element lying in a refinement region with a parameter value previously established lying outside the range of target values, for the previously established parameter value, can continue to be used. In this way the generation of incorrect or ambiguous parameter values in the range of values outside the highly accurate characteristic range of target values can be avoided. Thus, in this embodiment, ultimately only the parameter values of the refinement material parameters determined in a refined manner in the range of target values is accepted, so that regions of different resolutions related to the range of basic values are produced, which ultimately focus into the range of values of interest. Thus a certain analogy to an increase of the spatial resolution in the subregions of interest of the target region is produced, and a type of mosaic-like magnetic resonance data set arises, which contains the relevant information about the material parameters with high accuracy.

This concept may also be continued in relation to the spatial division of the magnetic resonance data set, if the refinement regions merely involve a subregion of the target region or a subregion of a previous refinement region. Preferably, with such a refinement restricted to a subregion of the target region or of a previous refinement region as refinement regions, there is provision outside of the refinement region, for the previously determined, best-resolved parameter values for obtaining a complete magnetic resonance data set for the target region to be retained.

In this context, in a further embodiment of the present invention, in a presentation of the data sets of different resolution, of a magnetic resonance data set covering material parameters, the part data sets are respectively shown so to be distinguishable visually in each case for different resolutions, such as with different colors. As well as the presentation of the parameter value at a location, it is advantageous with such a "mosaic measurement" to visualize the measurement accuracy at the same time. This is preferably done optically, for example by using a combined color and brightness scale wherein, for example, the parameter values determine the brightness, but the color specifies the precision with which these parameter values have been determined.

In the establishment of an optimally suited refinement magnetic resonance sequence, it is preferred for the refinement magnetic resonance sequence to be selected from a database that contains target resolutions and ranges of target values of specific material parameters as selection magnetic resonance sequences, with assigned comparison signals being assigned as optimally suited for these sequences. Comparison signals are determined by simulations in a number of cases, so that ultimately it is possible without any problem to discover suitable refinement magnetic resonance sequences for a number of material parameters, ranges of target values, and target resolutions. Usually the comparison signals also readily arise in this framework, since the suitability is defined by the ability to distinguish between these comparison signals, thus the uniqueness of possible fingerprints. Although brute force methods of operation are possible, it is of course also fundamentally possible to use more targeted techniques for finding optimum selection magnetic resonance sequences, since there is a sufficient amount of time available in advance of the actual application of the inventive method at a magnetic resonance apparatus. It is also possible, for each range of target values to be covered or each combination of ranges of target values to be covered, to store only the magnetic resonance sequences of best-possible target resolutions. In the consideration of a number of material parameters, magnetic resonance sequences each with best resolutions for the refinement material parameters of the sub-combination from selection magnetic resonance sequences are also retained for all possible sub-combinations that could be refinement parameters. Despite this, it is sensible in the second case, even if not absolutely necessary, to store not only the target resolutions but also the selection magnetic resonance sequences assigned, since a check can be made in this way as to whether an improvement in resolution will actually be achieved.

However it is also conceivable within the framework of the present invention for a refinement magnetic resonance sequence to be established in an optimization process. Then the corresponding calculations must ultimately be made on site, which means during the evaluation of the specific measurement result of the first pass of the series of establishing steps. This is less preferred, since a calculation in advance makes possible a real time capability of the method described here.

As already noted, the comparison signals to be assigned to the refinement magnetic resonance sequence can be established by simulation for different assignment values, which are selected on the basis of the target resolution and the range of target values. In such cases this type of simulation will be preceded by a complex measurement with phantoms and the like; preferably the simulations, as noted, take place before the actual use of the inventive method and will be carried out for selection magnetic resonance sequences in a database in which the corresponding comparison signals will then also be stored.

In another preferred embodiment, refinement regions that are smaller than the target region, or that are a previously used refinement region, will also be measured with a higher spatial resolution. This means that the inventive method, as well as a refinement of the range of values for the material parameters, can also include a refinement of the spatial resolution, as is basically already known, so that further and more precise information can also be established in this regard. For example, a spatial focusing on a conspicuous structure to be characterized in the target region can thus also be provided with higher spatial resolution.

It should again be noted that it is possible, within the framework of the present invention, to define the target region independently of a previous measurement or its parameter values. Then predetermined information, i.e. prior knowledge, can be used. If it is known, for example, that a patient is being examined for a specific type of brain tumor, expected parameter values will be known in advance and will define target regions. Should there be a diagnosis of a glioblastoma for example, it is known that characteristic combinations of T1 and T2 occur, so that measurements can be made explicitly in the range of values of such a tumor class. Such typical ranges of values can be derived, for example, from histograms known a priori, for example from measurements on persons exhibiting a corresponding pathology.

As well as the method, the invention concerns a magnetic resonance apparatus, having a control computer designed to operate the MR data acquisition scanner of the apparatus in order to implement the inventive method. In particular, as is known, such an MR apparatus has a sequence controller that, within the framework of a magnetic resonance sequence, activates other components of the magnetic resonance scanner, in particular the gradient coil arrangement and the radio-frequency coil arrangement, so that magnetic resonance signals can be measured. In addition the control computer has a material parameter establishment processor, which is in communication with a database in which comparison signals for different magnetic resonance sequences of the quantitative magnetic resonance imaging are stored. The database can be in a memory of the magnetic resonance apparatus, but also can be accessible externally via a communication link. The control computer also has a refinement processor that is configured to evaluate parameter values of material parameters of a previous pass of a series of establishing steps, in order to determine refinement material parameters, refinement regions, target value ranges and target resolutions and to select a refinement magnetic resonance sequence optimized therefor, in particular from the selection magnetic resonance sequences in the database. All remarks relating to the inventive method apply accordingly to the inventive magnetic resonance apparatus.

The present invention also encompasses a non-transitory, computer-readable data storage medium that can be loaded into a computer system of a magnetic resonance apparatus, and that is encoded with program code that causes the computer system to execute the method according to the invention as described above.

The storage medium is loaded directly into a memory of a control computer of a magnetic resonance device apparatus, and the program code causes the steps of a method described herein to be implemented when the program code is executed in the control computer of the magnetic resonance apparatus.

The data storage medium can be, for example a DVD or a CD-ROM. The remarks relating to the inventive method also apply to the data storage medium.

DESCRIPTION OF THE PREFERRED EMBODIMENTS

Figure 1:
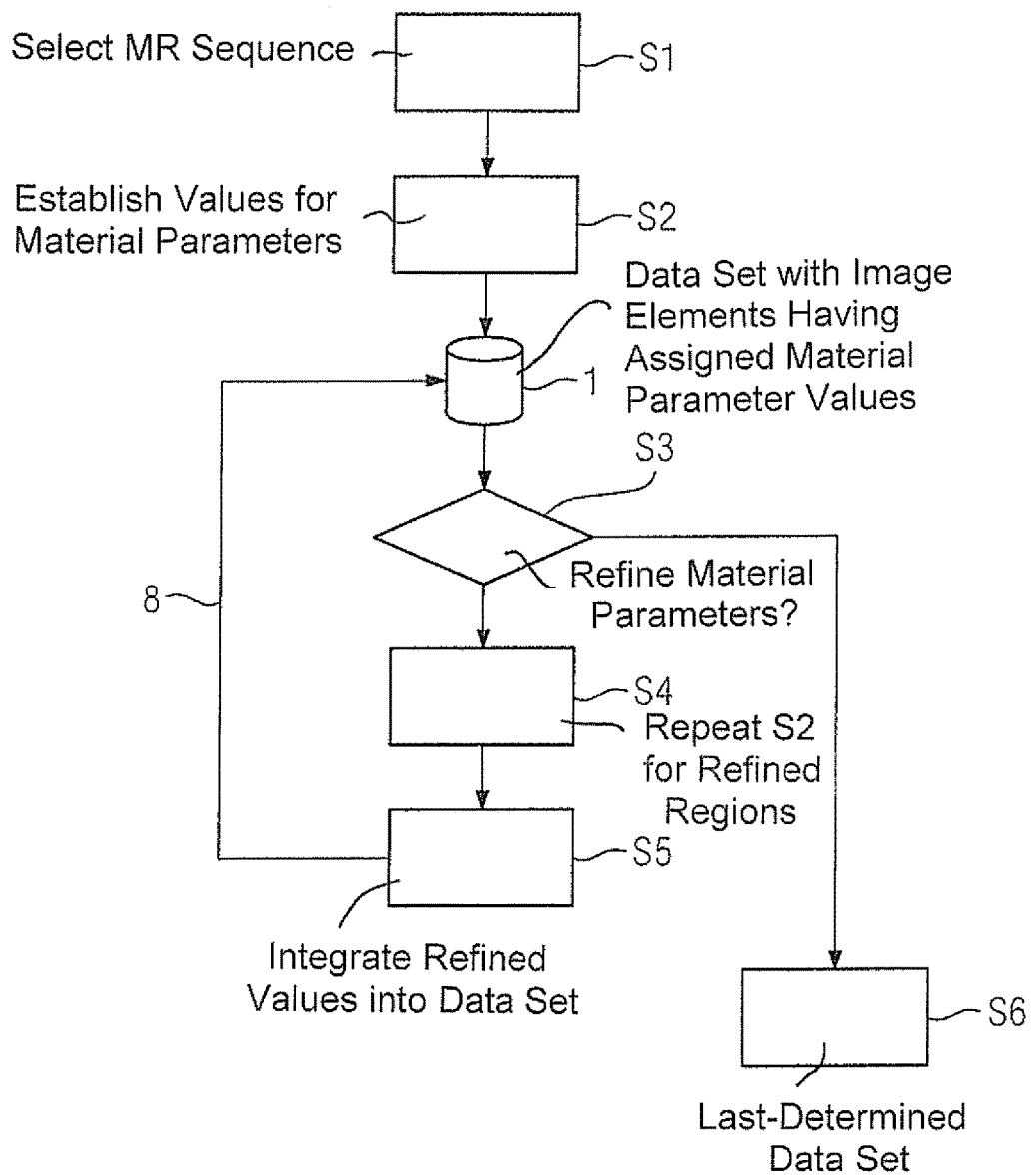
FIG. 1 is a flowchart of an exemplary embodiment of the inventive method.

An exemplary embodiment of the inventive method, as can be used within the framework of magnetic resonance fingerprinting, will be presented with reference to FIG. 1. Material parameters describing various material characteristics in a target region of an examination object, here of a patient, are to be established here, for example the T1 relaxation time, the T2 relaxation time, the T2* relaxation time and/or the proton density. The aim of the examination can be the more precise analysis of a tumor or of another lesion for example.

In this method, in a step S1, a basic magnetic resonance sequence is initially selected, which makes possible a good distinction of magnetic resonance signals, which arise in accordance with an excitation contained within them, in particular a combined excitation, in ranges of basic values for the material parameters through to a basic resolution. The magnetic resonance signals, which for example can be based on a pseudo-randomized sequence of excitation pulses, represent a type of fingerprint of the material, in particular tissue, in the corresponding image element. In other words a characteristic of the magnetic resonance signals is produced, which is typical for specific combinations of parameter values of the material parameters. The range of basic values for the various material parameters and thus the basic magnetic resonance sequence can be selected, for example, so that all parameter values for the material parameters that might possibly occur in the target region are covered by the range of basic values. This is usually associated with sacrifices in the basic resolution, since as from specific differences of the values of the material parameter in a combination, magnetic resonance signals may no longer be sufficiently or uniquely differentiated. The basic resolution can still be selected extremely coarse in such cases in the inventive method, since at later points in time refinement is to take place in any event, in the sense of measurement time optimization, for example in 100 millisecond steps or even 1000 millisecond steps for the relaxation times.

Then, in step S2 a series of establishing steps is carried out, in which initially within the framework of the basic magnetic resonance sequence, magnetic resonance signals of a measurement region will be recorded, according to which, for establishing the parameter values of each material parameter for each image element, comparisons of the recorded magnetic resonance signals with comparison signals assigned to the basic magnetic resonance sequence are undertaken. The comparison signals, which correspond to specific combinations of parameter values of the material parameters, which are to be called assignment parameter values here, and have been established in advance by simulations, are frequently also referred to as a dictionary for the magnetic resonance signals, i.e. the fingerprints. The number of the comparison signals and their assignment values are selected in such cases so that overall the range of basic values will be covered in the basic resolution. The comparison can be made by a correlator, for example. In the present example the assignment values, for which the highest correlation of the comparison signal with the magnetic resonance signal is given, are employed as parameter values for the image element of the magnetic resonance signal, so that, as a conclusion of step S2, a magnetic resonance data set 1 is produced, in which each image element corresponding to a spatial part of the target region is assigned corresponding parameter values of the material parameters. These are initially only coarsely resolved, since the ranges of basic values and the basic resolutions were actually used. In this sense this magnetic resonance data set first established in step S2 can be understood as a type of overview measurement.

In a step S3 it is now decided whether a refinement is to be carried out in refinement regions at least for refinement material parameters among the material parameters considered overall. This is done on the basis of the magnetic resonance data set 1, as has been established in step S2, by analysis thereof. Within the magnetic resonance data set 1 in such cases, in the exemplary embodiment described here (in particular as spatial subregions) refinement regions of the target region recorded in step S2 are to be discovered, in which the range of values for the at least one refinement material parameter is able to be restricted to a range of target values that is smaller than the range of basic values, so that another magnetic resonance sequence can be employed as refinement magnetic resonance sequence, which allows a higher resolution in relation to the at least one refinement material parameter, for which comparison signals that are assigned to the refinement magnetic resonance sequence are able to be distinguished sufficiently clearly, even for small spacings of assignment values of the material parameters. Only in the event of there being no refinement possibility that is sensible being produced in step S3 does the method end in step S6 with the last magnetic resonance data set 1 determined, which can also be displayed there, which will be explained in greater detail below.

However it is to be assumed at least after the overview measurement that conspicuous ranges of parameter values, which justify subsequent refinement measurements, are produced. Examples of these will be explained in greater detail using FIGS. 2 and 3.

Figure 2:
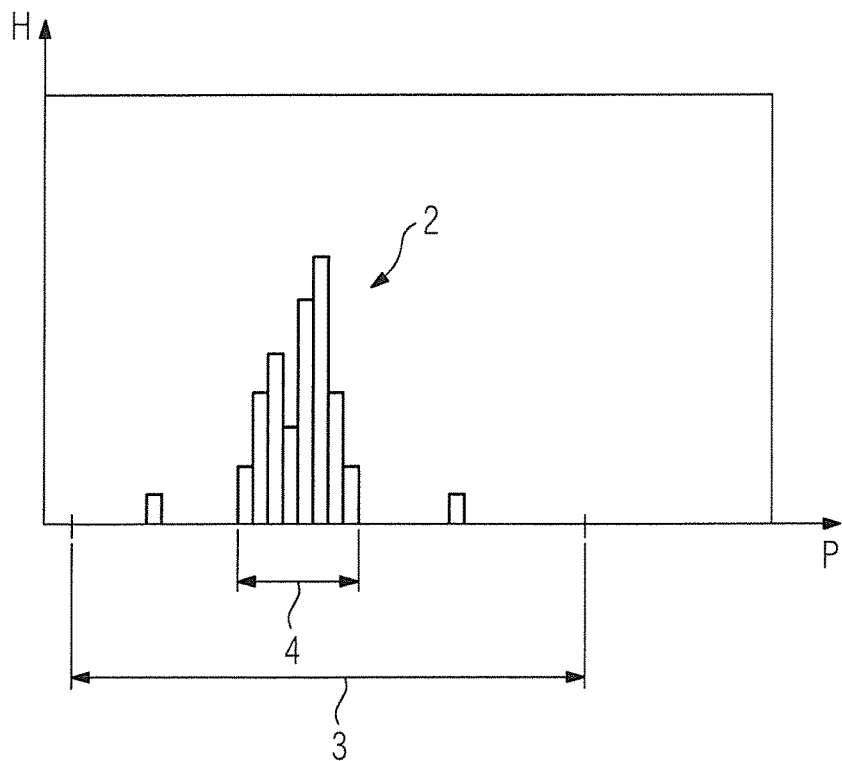
FIG. 2 shows an example of a histogram of a parameter value distribution.

FIG. 2 shows a first example of a histogram 2 of a parameter value distribution of a material parameter, wherein the frequency H is plotted against the parameter P and the range of basic values 3 is marked. The histogram 2 can in particular relate to a candidate region for a refinement region, which is thus formed from a number of image elements.

This clearly shows that in histogram 2 a peak-like accumulation of parameter values occurs in a range of sub-values greatly restricted by comparison with the range of basic values 3, which in the present case can be employed as the range of target values 4. If refinement regions, refinement material parameters and ranges of target values 4 are to be determined automatically, a check on a refinement criterion can take place for example in the candidate region as to whether more than one predetermined proportion, for example 80% or 90%, of the parameter values, lies in the potential range of target values 4, which in addition is sufficiently restricted by comparison with the range of basic values 3. Part of the refinement criterion can also be whether, for the range of target values 4 and a corresponding target resolution improved compared to the basic resolution, suitable selection magnetic resonance sequences are available in a database for selection as an optimally suited refinement magnetic resonance sequence. It can be seen that a number of concrete possibilities are conceivable for automatically (or even at least partly with manually assistance) discovering refinement regions and ranges of target values 4, which then, as described below, can be measured to obtain the increased target resolution in the range of target values 4.

Figure 3:
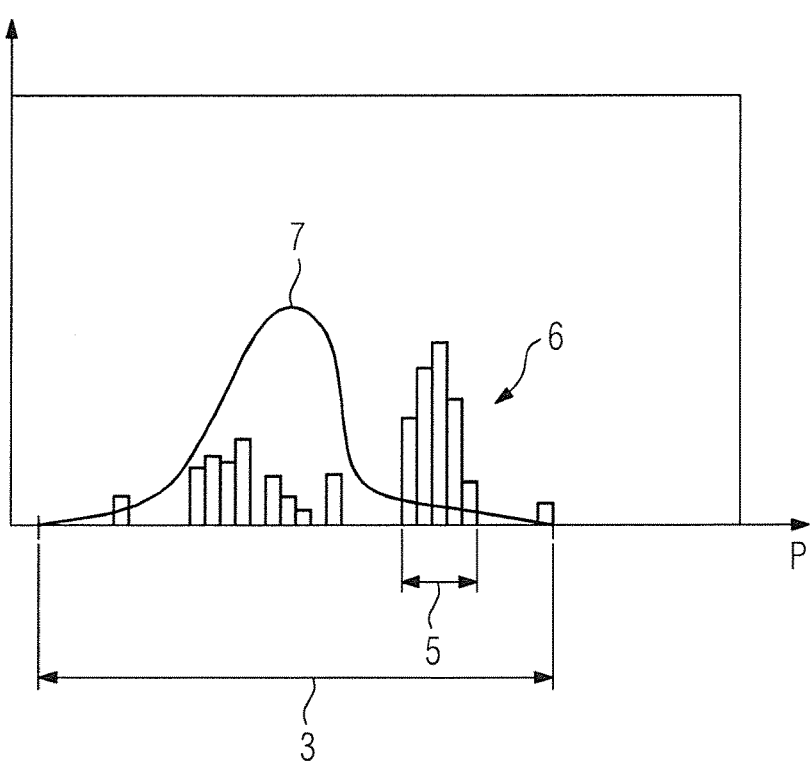
FIG. 3 shows a further example of a histogram of a parameter value distribution.

Another example for conspicuous parameter value distributions and ranges of target values 5 able to be derived therefrom is offered by the further exemplary histogram 6 of a parameter value distribution in FIG. 3. In said histogram the peak of FIG. 2 is evidently markedly reduced in its height, wherein however an unusual accumulation of parameter values occurs in another subregion of the range of basic values 3, which would not have been expected in accordance with a normal distribution 7, thus indicating a lesion, for example a tumor. Accordingly in such a case, if necessary even independent of the question of the proportion of the parameter values that is contained there, the corresponding subregion of the range of basic values 3 can be used as the range of target values 5, wherein usually the refinement region is then to be selected so that the structure giving rise to the unusual parameter values is outlined as exactly as possible, actually as many parameter values as possible actually lie in the range of target values 5. It should also be noted that it does no harm for parameter values lying outside the range of target values 5 not to be defined any more precisely, since ultimately it is a matter of characterizing the lesion as precisely as possible; but it is basically also possible to use refinement measurements even for the same refinement region with different ranges of target values.

Also in step S3, refinement magnetic resonance sequences optimally suited to the range of target values, which offer the best possible improvement of the resolution compared to the basic resolution, are then selected from selection magnetic resonance sequences of a database for the range of target values, which as well as the selection magnetic resonance sequences (with assigned ranges of values and if necessary resolutions) also contains the corresponding assigned comparison signals, thus the "dictionaries" assigned to the corresponding selection magnetic resonance sequences. These have been determined within the framework of simulations, in which the selection magnetic resonance sequences covering as many ranges of target values 4, 5 as possible have been produced. This is because in the evaluation as to whether a magnetic resonance sequence is suitable for a range of values with the highest possible resolution of parameter values, it is insured that as clear a distinction as possible of the various comparison signals, which arise for the desired resolution, is available so that thus, in the establishment of suitable selection magnetic resonance sequences in the present example, even the correspondingly assigned "dictionaries" are also produced. In terms of time, all of this, i.e. the compilation of the database, already occurs long before the carrying out of the method described here in accordance with FIG. 1, since the corresponding database is of course suitable and can be used for a number of specific measurements, wherein in addition the necessary calculation time can already be employed in advance.

Then, in a step S4, the series of establishing steps already described in relation to step S2 is carried out again, but this time for the refinement regions and the refinement magnetic resonance sequences with the assigned ranges of target values 4, 5 and target resolutions.

In step S5, the result parameter values of step S4 are then integrated into the magnetic resonance data set 1, wherein refinement information will also then be assigned to the respective image elements. In such cases mosaic-like combinations can arise as well within the refinement regions, since when a parameter value that lies outside the corresponding range of target values 4, 5 was already present within a refinement region, to avoid incorrect determinations and inconsistencies, this value is retained, since the refinement magnetic resonance sequence was then not actually suitable to determine a correspondingly more accurate value reliably here. Also in subregions of the target region outside refinement regions the previous parameter values will of course be retained, in order to retain a complete magnetic resonance data set 1 of the target region, which then moreover, as indicated by the arrow 8, will be used as the basis for further deliberations for refinement in step S3. The improvement of the resolution can thus, if desired, occur in a number of steps.

It should also be noted that, within the framework of the present invention, it is also possible to also increase the spatial resolution in the refinement regions at the same time as increasing the resolution in relation to the parameter values, in order by doing so to unify a zoom function with a more precise determination of the parameter values.

Figure 4:
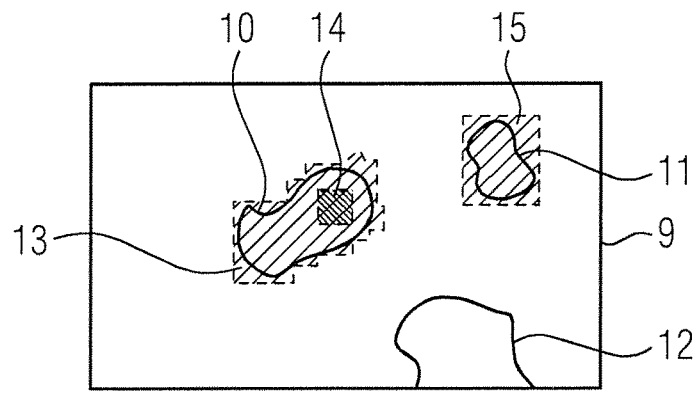
FIG. 4 schematically illustrates a magnetic resonance data set established with the method.

In step S6 there can also be a presentation of material parameter maps derived from the magnetic resonance data set 1, wherein it is expedient in such cases also to integrate a visual identification of the measurement resolutions. If for example the parameter values are shown encoded in brightness ("gray scale"), a colored background of the corresponding image elements can show the resolution for which the parameter value has been measured. This is to be seen purely as a broad outline by the label 9 of FIG. 4. Various structures 10, 11, 12 in the target region can be seen there, of which a more precise measurement of parameter values has been used for the structures 10, 11, in the case of the structure 10, even an extremely precise measurement in a subregion, in order to classify a tissue extremely exactly for example. Although, as a result of the mosaic-type combination in step S5, lower-resolution parameter values can also still be present in the refinement regions, to simplify the diagram in FIG. 4, a cross-hatching showing specific color coding is shown in each case for the refinement regions 13, 14 and 15.

Figure 5:
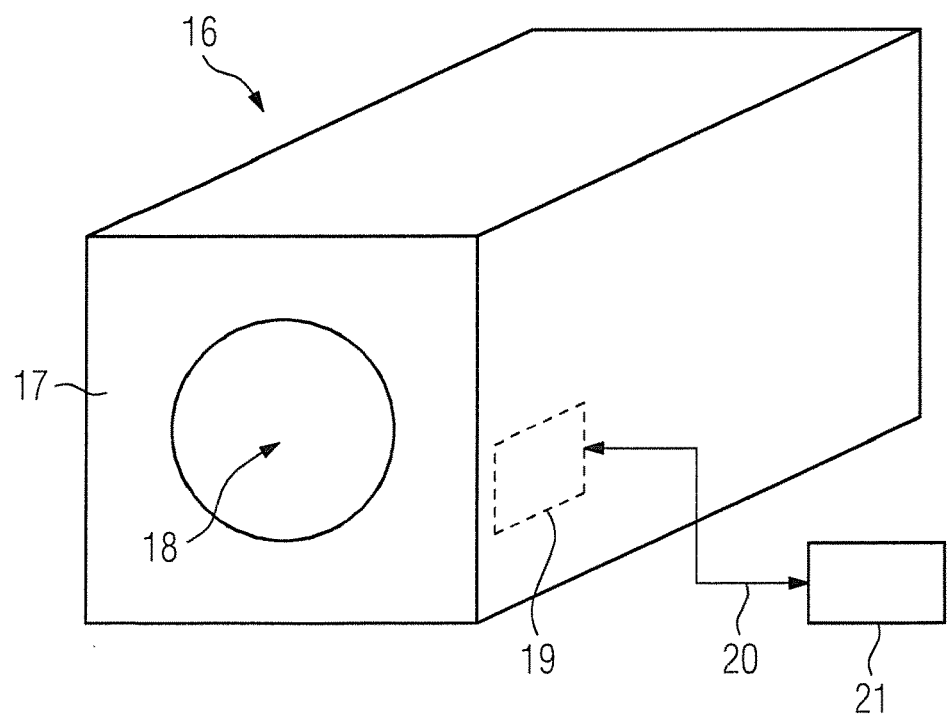
FIG. 5 shows an inventive magnetic resonance device.

FIG. 5 shows a block diagram of an inventive magnetic resonance apparatus 16, which, as is fundamentally known, has a scanner that forms a basic field magnet 17, which generates the basic field, and that also defines the patient receiving area 18, which is surrounded here by a radio-frequency coil arrangement and a gradient coil arrangement (not shown). The operation of the magnetic resonance apparatus 16 is controlled by a control computer 19, which is designed for carrying out the inventive method and in the present case, in accordance with the arrow 20, also for communication with the database 21, in which the basic magnetic resonance sequence and the selection magnetic resonance sequence can be stored, each with their assigned dictionaries. The database 21 can in this case be present on a central server for example, to which there can be access via the Internet or an Intranet, so that it can be used at a number of magnetic resonance apparatuses. The database 21, however, can also form part of the control computer 19.

As well as the fundamentally known sequence controller and the parameter value establishment processor, the control computer 19 in the present example also has a refinement processor, in order, as explained in relation to step S3, to be able to pre-plan possible refinements of the resolution of material parameters.

The method described herein can also be available in the form of stored computer code, which implements the method in the control computer 19 when executed thereon. The code is stored on an electronically readable data medium as electronically readable control information. When this data storage medium is loaded in the control computer 19 of the magnetic resonance device 16, the code causes the computer 19 to implement the described method.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for recording a magnetic resonance (MR) data set, comprising:
   (a) with a processor, operating an MR data acquisition scanner to execute a basic MR data acquisition sequence in order to acquire MR signals from a region of a subject for a plurality of image elements in an image of said region, each image element representing a parameter value of a material parameter of the subject;
   (b) in said processor, accessing a memory in which a plurality of comparison signals are stored respectively for different material parameters, in order to identify, for each respective image element, the parameter value represented thereby, by comparing the acquired MR signal for the respective image element to comparison signals accessed from said memory and assigning a parameter value, as a basic value, to the respective image element that corresponds to the parameter value of the comparison signal that is a closest match to the acquired MR signal of the respective image element, and thereby producing, for each material parameter, a range of basic values, has a basic resolution, over said region;
   (c) in said processor, at least locally refining said basic resolution, for at least one refinement material parameter among said different material parameters, in a refinement region that is at least a part of said region, by selecting a refinement MR data acquisition sequence that is optimized with respect to an ability to distinguish said comparison signals with a target resolution in a range of target values of said at least one material parameter in said refinement region;
   (d) in said processor, selecting said refinement sequence dependent on at least one of said at least one refinement material parameter, and predetermined information;
   (e) repeating (a) and (b) to operate said scanner with said refinement sequence instead of said basic sequence, to acquire a range of target values of said at least one refinement material in said refinement region instead of said range of said basic values in said region, with said target resolution instead of said basic resolution; and
   (f) making said range of target values with said target resolution available in electronic form from said processor as a data file.

2. A method as claimed in claim 1 comprising, after (e), implementing at least one further refinement of the target resolution for said at least one refinement material parameter.

3. A method as claimed in claim 1 wherein step (d) comprises selecting said refinement sequence also dependent on parameter values of material parameters in said refinement region that are not to be refined as to their resolution.

4. A method as claimed in claim 1 comprising executing (a) through (f) in an MR fingerprinting procedure.

5. A method as claimed in claim 1 comprising using at least one of relaxation time and proton density as said material parameter.

6. A method as claimed in claim 1 comprising, in (c), determining at least one of said refinement material parameter, said refinement region and said refinement sequence by an analysis of a distribution of said parameter value in said basic range for a plurality of image elements.

7. A method as claimed in claim 6 comprising using a histogram of said parameter value over said plurality of image elements, as said parameter value distribution.

8. A method as claimed in claim 6 comprising, from said parameter value distribution, identifying a refinement criterion that describes accumulations of values of said parameter value in said parameter value distribution that deviate from a normal distribution.

9. A method as claimed in claim 6 comprising selecting at least one refinement region as a sub-region of said target region as at least one of a sub-region containing a parameter value that deviates from a normal distribution, a sub-region that is a predetermined region of interest, and a sub-region determined by analysis of a preceding scan, before (a) of said region.

10. A method as claimed in claim 1 comprising, for an image element in a refinement region having a previously-established parameter value that is outside said range of target values, continuing to use the previously established parameter value.

11. A method as claimed in claim 1 comprising, when said target region is smaller than said region, retaining best-resolved parameter values represented by said MR signals in (a) in the data file in (f).

12. A method as claimed in claim 1 comprising, at a display in communication with said processor, displaying a visual representation of said data file, with regions in the displayed data file exhibiting different resolutions being displayed with a different visual appearance.

13. A method as claimed in claim 1 comprising, in (d), selecting said refinement sequence by accessing, from said processor, a database containing target resolutions and ranges of target values of different material parameters.

14. A method as claimed in claim 1 comprising, in (d), selecting said refinement sequence by executing an optimization algorithm.

15. A method as claimed in claim 1 comprising establishing said comparison signals accessed in (e) as a selection of the comparison signals in said memory based on said target resolution and said range of target values.

16. A method as claimed in claim 1 comprising, when said refinement region is smaller than said target region or is a previously-used refinement region, repeating (a) and (b) in (e) with a higher spatial resolution than in an earlier execution of (a) and (b).

17. A magnetic resonance (MR) apparatus comprising:
an MR data acquisition scanner;
a processor configured to (a) operate said MR data acquisition scanner to execute a basic MR data acquisition sequence in order to acquire MR signals from a region of a subject for a plurality of image elements in an image of said region, each image element representing a parameter value of a material parameter of the subject;
a memory in which a plurality of comparison signals are stored respectively for different material parameters;
said processor being configured to (b) access said memory in order to identify, for each respective image element, the parameter value represented thereby, by comparing the acquired MR signal for the respective image element to comparison signals accessed from said memory and assigning a parameter value, as a basic value, to the respective image element that corresponds to the parameter value of the comparison signal that is a closest match to the acquired MR signal of the respective image element, and thereby producing, for each material parameter, a range of basic values, has a basic resolution, over said region;
said processor being configured to at least locally refine said basic resolution, for at least one refinement material parameter among said different material parameters, in a refinement region that is at least a part of said region, by selecting a refinement MR data acquisition sequence that is optimized with respect to an ability to distinguish said comparison signals with a target resolution in a range of target values of said at least one material parameter in said refinement region;
said processor being configured to select said refinement sequence dependent on at least one of said at least one refinement material parameter, and predetermined information;
said processor being configured to repeat (a) and (b) to operate said scanner with said refinement sequence instead of said basic sequence, to acquire a range of target values of said at least one refinement material in said refinement region instead of said range of said basic values in said region, with said target resolution instead of said basic resolution; and
said processor being configured to make said range of target values with said target resolution available in electronic form from said processor as a data file.

18. A non-transitory, computer-readable data storage medium encoded with programming instructions, said storage medium being loaded into a computer system of a magnetic resonance (MR) apparatus that comprises an MR data acquisition scanner, said programming instructions causing said computer system to:
(a) operate said MR data acquisition scanner to execute a basic MR data acquisition sequence in order to acquire MR signals from a region of a subject for a plurality of image elements in an image of said region, each image element representing a parameter value of a material parameter of the subject;
(b) access a memory in which a plurality of comparison signals are stored respectively for different material parameters, in order to identify, for each respective image element, the parameter value represented thereby, by comparing the acquired MR signal for the respective image element to comparison signals accessed from said memory and assigning a parameter value, as a basic value, to the respective image element that corresponds to the parameter value of the comparison signal that is a closest match to the acquired MR signal of the respective image element, and thereby producing, for each material parameter, a range of basic values, has a basic resolution, over said region;
(c) at least locally refine said basic resolution, for at least one refinement material parameter among said different material parameters, in a refinement region that is at least a part of said region, by selecting a refinement MR data acquisition sequence that is optimized with respect to an ability to distinguish said comparison signals with a target resolution in a range of target values of said at least one material parameter in said refinement region;
(d) select said refinement sequence dependent on at least one of said at least one refinement material parameter, and predetermined information;
(e) repeat (a) and (b) to operate said scanner with said refinement sequence instead of said basic sequence, to acquire a range of target values of said at least one refinement material in said refinement region instead of said range of said basic values in said region, with said target resolution instead of said basic resolution; and (f) make said range of target values with said target resolution available in electronic form from said computer system as a data file.

\* \* \* \* \*